United States Patent
Amm et al.

(10) Patent No.: US 7,932,722 B2
(45) Date of Patent: Apr. 26, 2011

(54) TRANSVERSELY FOLDED GRADIENT COIL

(75) Inventors: Bruce Campbell Amm, Clifton Park, NY (US); Bulent Aksel, Clifton Park, NY (US); Kristen Ann Wangerin, Watervliet, NY (US)

(73) Assignee: General Electric Company, Niskayuna, NY (US)

( * ) Notice: Subject to any disclaimer, the term of this patent is extended or adjusted under 35 U.S.C. 154(b) by 190 days.

(21) Appl. No.: 12/430,874

(22) Filed: Apr. 27, 2009

(65) Prior Publication Data

US 2010/0271026 A1 Oct. 28, 2010

(51) Int. Cl.
*G01V 3/00* (2006.01)

(52) U.S. Cl. .................................. 324/318; 324/309

(58) Field of Classification Search .......... 324/300–322; 600/407–445
See application file for complete search history.

(56) References Cited

U.S. PATENT DOCUMENTS

| | | | |
|---|---|---|---|
| 4,646,024 A | 2/1987 | Schenck et al. | |
| 5,198,769 A | 3/1993 | Frese et al. | |
| 5,289,129 A | 2/1994 | Joseph | |
| 5,349,318 A | 9/1994 | Inoue | |
| 5,512,828 A | 4/1996 | Pausch et al. | |
| 5,554,929 A | 9/1996 | Doty et al. | |
| 5,561,371 A | 10/1996 | Schenck | |
| 5,886,548 A | 3/1999 | Doty et al. | |
| 5,939,882 A | 8/1999 | Gebhardt et al. | |
| 6,181,227 B1 * | 1/2001 | Schmidt et al. | 335/299 |
| 6,262,576 B1 * | 7/2001 | Petropoulos | 324/318 |
| 6,351,123 B1 | 2/2002 | Gebhardt | |
| 6,781,376 B2 | 8/2004 | Schaaf | |
| 7,633,295 B2 * | 12/2009 | Tyszka et al. | 324/318 |
| 2009/0083967 A1 * | 4/2009 | Meinke | 29/602.1 |
| 2009/0083968 A1 * | 4/2009 | Meinke | 29/602.1 |
| 2009/0083969 A1 * | 4/2009 | Meinke | 29/605 |

FOREIGN PATENT DOCUMENTS

| | | |
|---|---|---|
| GB | 2296329 A | 6/1999 |
| WO | WO9420862 A1 | 9/1994 |
| WO | WO2005088330 A1 | 9/2005 |
| WO | WO2007140089 A2 | 12/2007 |
| WO | WO2008122899 A1 | 10/2008 |

OTHER PUBLICATIONS

Intellectual Property Office Search Report dated Aug. 12, 2010.

* cited by examiner

*Primary Examiner* — Brij B Shrivastav
(74) *Attorney, Agent, or Firm* — Jason K. Klindtworth

(57) ABSTRACT

A gradient coil comprising: a pair of gradient coil units disposed so as to enclose a gradient axis, each gradient coil unit including: a gradient coil substrate with a primary coil section, a shield coil section, and first and second return path sections, the primary coil section disposed between the gradient axis and the shield coil section, the primary coil section configured to produce a magnetic gradient field at the gradient axis when conducting an electrical current; the first return path section foldably connected between the primary coil section and the shield coil section, and the second return path section foldably connected between the shield coil section and the primary coil section such that the gradient coil substrate forms a cylindrical surface having a longitudinal axis substantially aligned with the gradient axis; and a plurality of substantially parallel conductive paths disposed across the cylindrical surface in a direction transverse to the gradient axis.

20 Claims, 7 Drawing Sheets

TRANSVERSELY FOLDED GRADIENT COIL

BACKGROUND OF THE INVENTION

The subject matter disclosed herein relates to magnetic resonance imaging systems and, more particularly, to transversely folded gradient coils for producing substantially linear transverse magnetic fields in such systems.

Magnetic resonance imaging systems may include one or more magnetic gradient field coils configured to produce predefined magnetic fields when energized. It is known in the present state of the art to provide an actively-shielded transverse coil apparatus 10, such as shown in the simplified schematic view of FIG. 1. The coil apparatus 10 includes an outer coil section 11 and an inner coil section 21 disposed within the outer coil section 11. Both the outer coil section 11 and the inner coil section 21 are substantially cylindrical surfaces. The outer coil section 11 and the inner coil section 21 are shown concentrically positioned on a longitudinal axis 19, commonly referred to as the gradient axis, and are usually specified in the relevant art as the z-axis of a Cartesian coordinate system. The coil apparatus 10 typically includes a number of gradient coils for producing the desired, primary magnetic field in an imaging volume 20 when powered by electrical current.

In the example shown, the inner coil section 21 includes a first inner gradient coil 23, here shown disposed to the left of the x-y plane, and a second inner gradient coil 25, here shown disposed to the right of the x-y plane. Each inner gradient coil 23 and 25 extends substantially across half the circumference of the inner coil section 21, both here shown lying above the y-z plane. In a typical configuration, the inner coil section 21 includes third and fourth inner gradient coils (not shown for clarity of illustration) disposed on the lower surface of the inner core section 21 (i.e., below the y-z plane). Each of the four inner gradient coils includes a folded-loop current path (not shown for clarity of illustration) configured such that, when powered, each folded-loop current path generates a respective magnetic gradient field component in the imaging volume 20.

The outer coil section 11 includes a first outer gradient coil 13 disposed radially outward of the first inner gradient coil 23, and a second outer gradient coil 15 disposed radially outward of the second inner gradient coil 25. Each outer gradient coil 23 and 25 extends substantially across half the circumference of the outer coil section 11 so as to cancel or shield that portion of the primary magnetic field generated by the inner gradient coils 23 and 25 that might otherwise extend radially beyond the outer coil section 11. This shielding is accomplished by means of an opposing magnetic field component generated by a folded-loop current path (not shown for clarity of illustration) provided on each of the outer gradient coils 23 and 25. The current in each outer folded-loop current path flows opposite to the current flow in the adjacent inner folded-loop current path to generate the opposing magnetic field component. The outer coil section 11 also includes third and fourth outer gradient coils (not shown) on the outer coil section 11 lying below the y-z plane and disposed radially outward of the corresponding third and fourth inner gradient coils 23 and 25. A current return path (not shown) is provided for transport or continuity of the current flowing in the outer gradient coil 13 and the inner gradient coil 23 to produce a closed coil pattern on the surfaces of the coil sections.

U.S. Pat. No. 5,349,381 "Double type coil for generating slant magnetic field for MRI", for example, discloses a gradient coil comprising spiral-shaped current path patterns formed on double semi-cylindrical surfaces having a common axis. The current paths are connected in series to form a single current path, the disclosed design providing a folded return current path between a primary surface and a shield surface. U.S. Pat. No. 5,512,828 "Actively shielded transverse gradient coil for nuclear magnetic resonance tomography apparatus" discloses an actively shielded transverse gradient coil arrangement having a longitudinal folding of current paths between a primary coil and a secondary coil.

However, although current folding may increase coil efficiency and improve shielding, manufacturing complexity may be increased. Moreover, the folded configuration limits physical access from the end of the gradient coil to the space between the primary surface and the shield surface. One configuration intended to improve these shortcomings is disclosed in U.S. Pat. No. 5,886,548 "Crescent gradient coils," in which current conductors are wrapped in a crescent shaped arrangement. The crescent-shaped, axially aligned coils may also be used in conjunction with Golay-type coils. Such transversely wound coils, however, may fail to meet certain gradient linearity, uniformity, or leakage field requirements specified for imaging applications.

What is needed is a distributed-current transverse gradient coil design that produces a linear transverse gradient magnetic field and overcomes the shortcomings of the prior art.

BRIEF DESCRIPTION OF THE INVENTION

In one aspect of the present invention, a gradient coil is disclosed comprising: a first gradient coil unit and a second gradient coil unit disposed so as to enclose a gradient axis therebetween, each gradient coil unit including: a gradient coil substrate with a primary coil section, a shield coil section, a first return path section, and a second return path section, the primary coil section disposed between the gradient axis and the shield coil section, the primary coil section configured to produce a magnetic gradient field at the gradient axis when conducting an electrical current; the first return path section foldably connected between the primary coil section and the shield coil section, and the second return path section foldably connected between the shield coil section and the primary coil section such that the gradient coil substrate forms a cylindrical surface having a longitudinal axis substantially aligned with the gradient axis; and a plurality of substantially parallel conductive paths disposed across the cylindrical surface in a direction transverse to the gradient axis.

In another aspect of the present invention, a magnetic resonance imaging system is disclosed comprising: a main magnet enclosing an imaging volume; an RF coil disposed within the main magnet; and a gradient coil assembly disposed within the RF coil, the gradient coil assembly having a pair of gradient coil substrates, each gradient coil substrate including: a primary coil section configured to produce a magnetic gradient field at a gradient axis; a shield coil section foldably connected with the primary coil section, the shield coil section further disposed between the primary coil section and the main magnet; and a plurality of substantially parallel conductive paths disposed across the gradient coil substrate in a direction transverse to the gradient axis; and a gradient amplifier for powering the gradient coil assembly.

In yet another aspect of the present invention, a method for fabricating a gradient coil for producing a magnetic gradient field comprises: obtaining at least one of linearity, uniformity, and leakage requirements for the magnetic gradient field; selecting two-dimensional series functions for determining current patterns to be implemented on a gradient coil substrate having a primary coil section and a shield coil section; selecting surface stream function coefficients $A_{ij}$; creating a surface stream function having the format $F=\Sigma_i\Sigma_j A_{ij}u_i v_j$; calculating the effect of each stream function coefficient $A_{ij}$ on the primary coil section and the shield coil section; verifying that each stream function coefficient $A_{ij}$ satisfies at least one linearity, uniformity, and leakage requirement; discretizing the stream function into a primary conductive path pattern and a shield conductive path pattern; and forming primary conductive paths and shield conductive paths on the gradient coil substrate in accordance with the primary conductive path pattern and a shield conductive path pattern.

Other devices and/or methods according to the disclosed embodiments will become or are apparent to one with skill in the art upon review of the following drawings and detailed description. It is intended that all such additional devices and methods are within the scope of the present invention, and are protected by the accompanying claims.

DETAILED DESCRIPTION OF THE INVENTION

Disclosed is a transversely-folded gradient coil having a shielded-gradient design, and configured to actively cancel that portion of a generated and contained magnetic field that would otherwise extend outside of a coil apparatus. The transversely-folded gradient coil comprises a folded current return path extending between a primary coil surface and a shield coil surface, along a surface that is generally parallel to a gradient axis. This configuration improves physical access to a region lying between the primary and shield coils and further improves gradient performance and linearity, and reduces coil inductance by reducing path conductor length.

The present invention also provides for a method of determining the current paths required to meet the linearity, uniformity, and leakage field requirements of a magnetic gradient with a transversely-folded gradient coil. The method uses a stream function for determining current density, where the stream function utilizes the outer product of a series expansion in the current loop direction and the axial direction of the gradient coil. Further constraints are added to ensure that current remains inside the surface boundaries of the corresponding coil sections. The stream function coefficients may be calculated using linear or quadratic programming methods. The particular location of the current return path between coil sections is selected so as to facilitate fabrication of the coil apparatus without incurring current paths detrimental to the desired primary magnetic field pattern.

Figure 1:
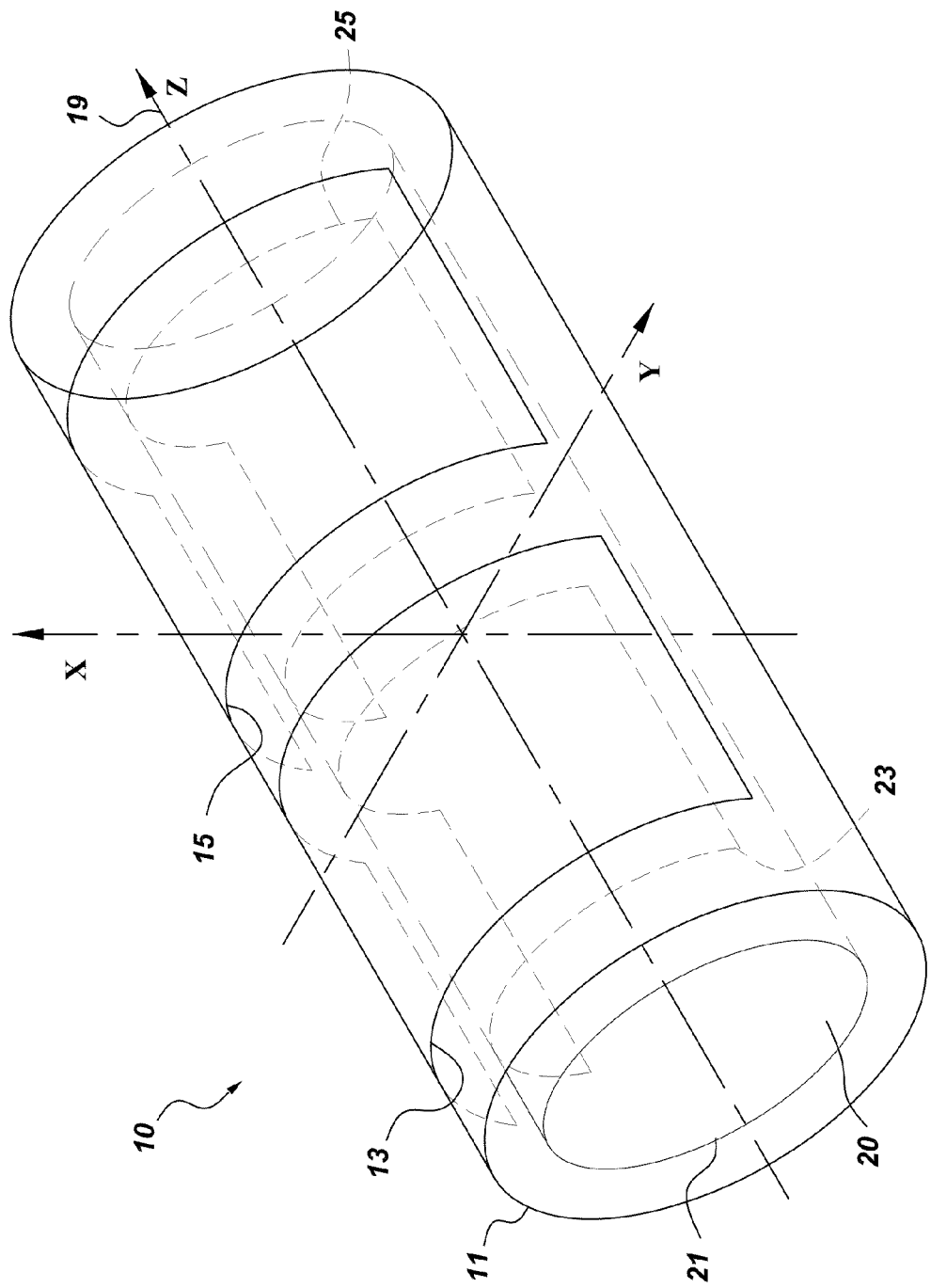
FIG. 1 is a simplified illustration of a coil apparatus including outer and inner coil sections, in accordance with the prior art.
Figure 2:
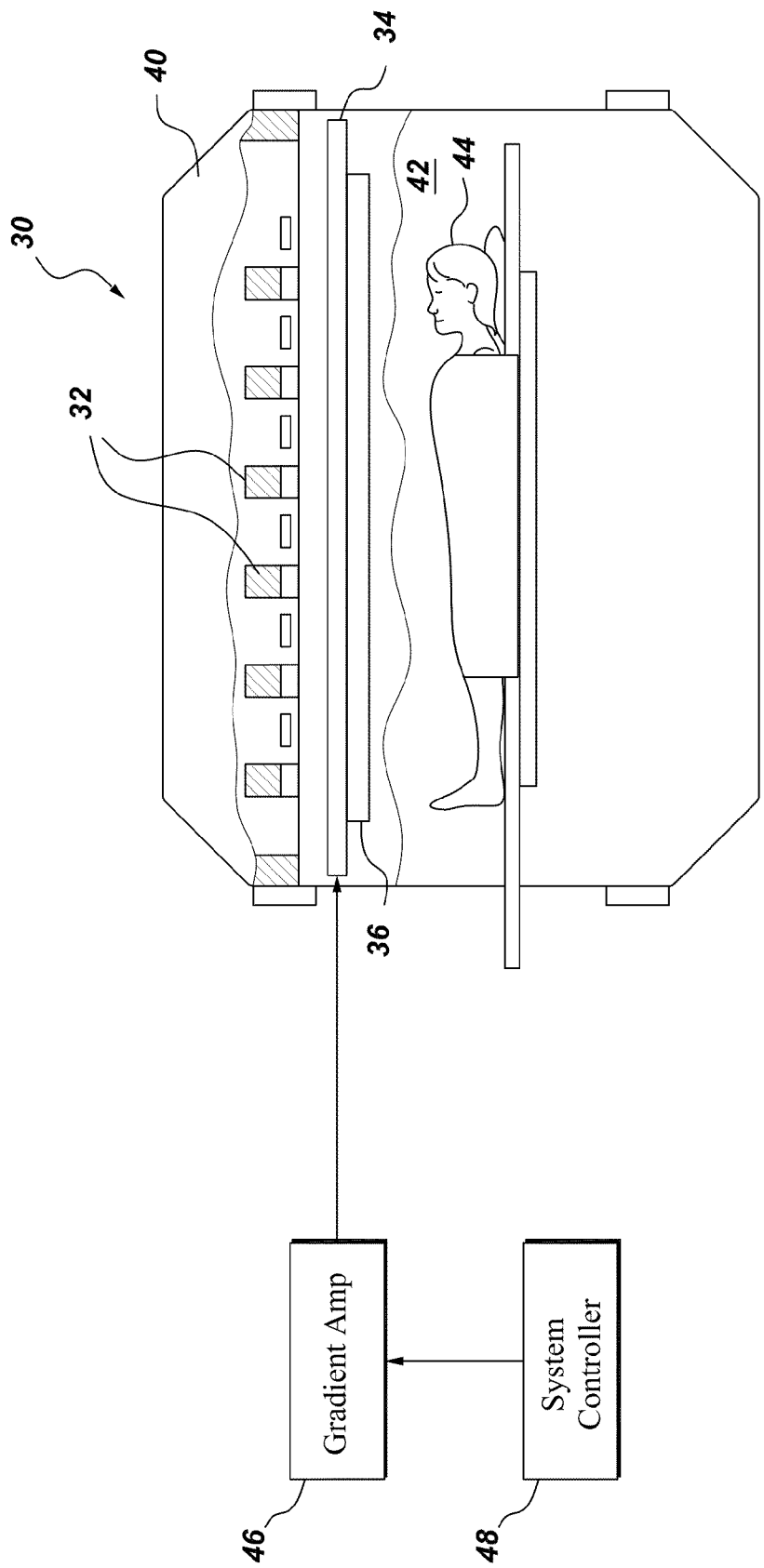
FIG. 2 is a simplified representation of a magnetic resonance unit including a gradient coil, in accordance with an aspect of the present invention.
Figure 3:
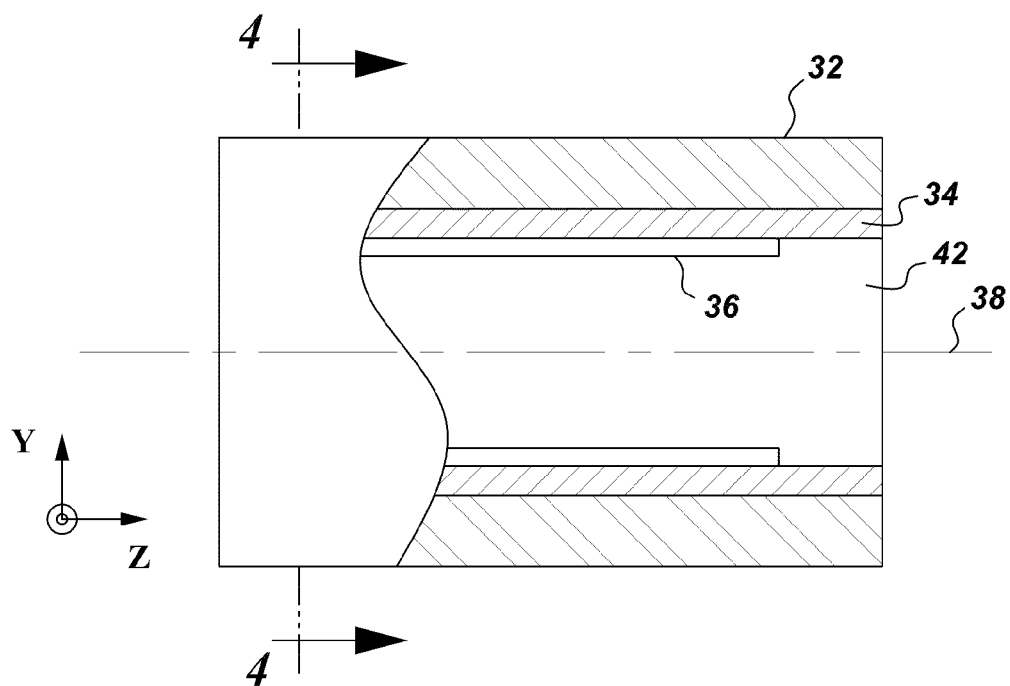
FIG. 3 is a transverse cross-sectional diagrammatical illustration of the gradient coil of FIG. 2.
Figure 4:
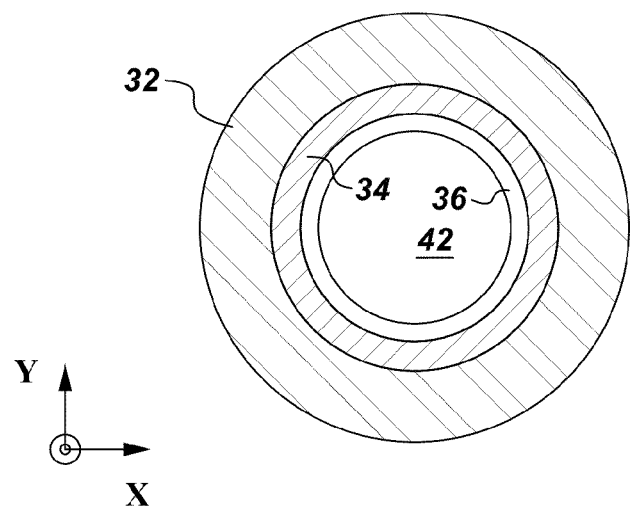
FIG. 4 is a longitudinal cross-sectional diagrammatical illustration of the gradient coil of FIG. 3.

A simplified representation of a magnetic resonance unit 30 is provided in FIG. 2. The magnetic resonance unit 30 may include a main magnet 32, a gradient coil 34, and an RF coil 36 secured within a housing 40. An imaging volume, or chamber 42, may be configured in the housing 40 to receive a patient 44 undergoing examination, for example. The main magnet 32 functions to generate a substantially constant magnetic field in the chamber 42. The gradient coil 34 may be powered by a gradient amplifier unit 46 operated by a system controller 48. As shown in the simplified illustrations of FIGS. 3 and 4, the chamber 42 may be a generally cylindrical volume having a gradient axis 38, the chamber 42 enclosed by the RF coil 36, the gradient coil 34, and the main magnet 32. The gradient coil 34 functions to produce magnetic gradient fields over a desired field of view in the chamber 42, and the RF coil 36 functions to generate an RF magnetic field.

Figure 5:
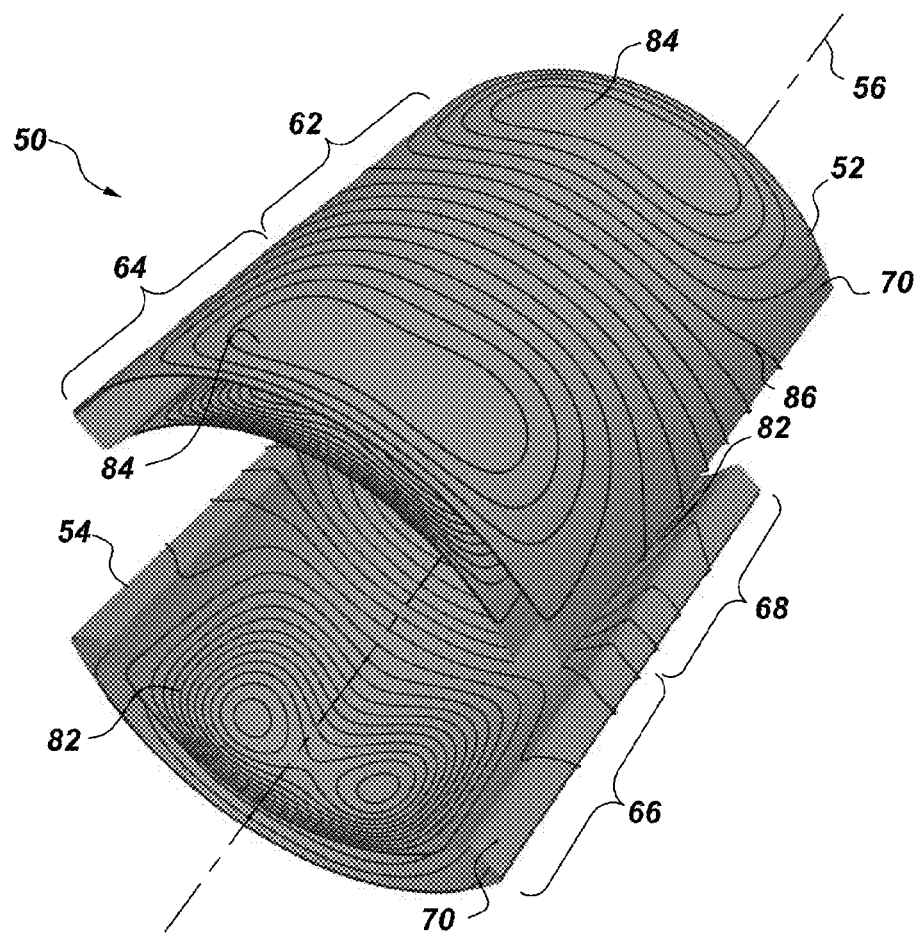
FIG. 5 is a simplified isometric diagrammatical illustration of a transversely folded gradient coil including an upper gradient coil unit and a lower gradient coil unit disposed about a gradient axis.

There is shown in FIG. 5 a diagrammatical isometric illustration of an exemplary embodiment of a transversely folded gradient coil assembly 50 suitable for use in the magnetic resonance unit 30. In one aspect of the present invention, the transversely folded gradient coil assembly 50 may comprise a first gradient coil unit 52 and a second gradient coil unit 54, each gradient coil unit 52 and 54 disposed about an enclosed gradient axis 56. The first gradient coil unit 52 may be viewed as comprising a first quadrant coil 62 in a "first quadrant" of the transversely folded gradient coil assembly 50, and a second quadrant coil 64 in a "second quadrant" of the transversely folded gradient coil assembly 50. The second quadrant coil 64 may be substantially a mirror image of the first quadrant coil 62.

It should be understood that the first quadrant coil 62 and the second quadrant coil 64 may be formed on a common gradient coil substrate 70 and may or may not be physically separate units. However, the first quadrant coil 62 and the second quadrant coil 64 are herein distinguished as coil "quadrants" primarily for convenience of description of the exemplary embodiments. Continuing this method of viewing the transversely folded gradient coil assembly 50, the second gradient coil unit 54 may be seen as comprising a third quadrant coil 66 and a fourth quadrant coil 68, where the third quadrant coil 66 is substantially a mirror image of the second quadrant coil 64 and the fourth quadrant coil 68 is substantially a mirror image of the first quadrant coil 62. The second gradient coil unit 54 thus may be viewed as being substantially a mirror image of the first gradient coil unit 52. The quadrant coils 62, 64, 66, and 68 may each be configured as described in greater detail below to produce a desired magnetic field of view within the magnetic resonance unit 30.

Figure 6:
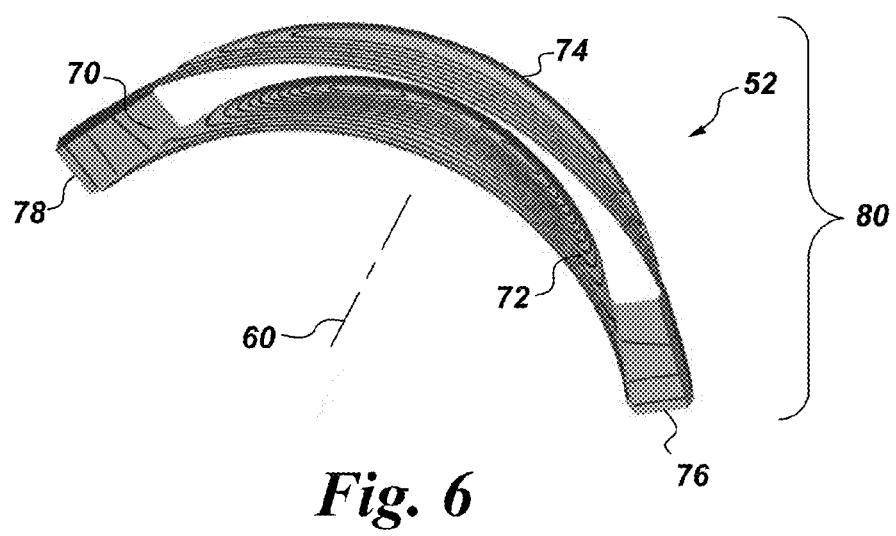
FIG. 6 is a simplified isometric diagrammatical illustration of a quadrant portion of the upper gradient coil unit of FIG. 5 including a primary coil section connected to a shield coil section by transverse return path sections.

FIG. 6 is a diagrammatical representation of the first gradient coil unit 52 as viewed along the general direction of the gradient axis 56. For clarity of illustration, only the "first quadrant" portion of the first gradient coil unit 52 is shown, but it should be understood that the following description applies to the entire first gradient coil unit 52 as well as to the second gradient coil unit 54. The first gradient coil unit 52 comprises a primary coil section 72 and a shield coil section 74 where: (i) the primary coil section 72 and the shield coil section 74 are foldably connected by means of a first return path section 76, and (ii) the primary coil section 72 and the shield coil section 74 are further foldably connected by means of a second return path section 78.

In an exemplary embodiment, the primary coil section 72 and the shield coil section 74 may define substantially circular or elliptical cylindrical arcs having a common longitudinal axis 60. The first return path section 76 and the second return path section 78 may define respective radial planes passing through the longitudinal axis 60. The shield coil section 74 is substantially parallel to and spaced apart from the primary coil section 72. The spacing between the shield coil section 74 and the primary coil section 72 may be approximately the same as the width of the first return path section 76 or the second return path section 78. Accordingly, the gradient coil substrate 70 in the primary coil section 72, the first return path section 76, the shield coil section 74, and the second return path section 78 may be seen as forming a closed cylindrical surface 80 with the longitudinal axis 60 substantially aligned with the gradient axis 56. The shield coil section 74 thus functions to shield and contain the magnetic field generated by the primary coil section 72 during operation of the magnetic resonance unit 30.

Figure 7:
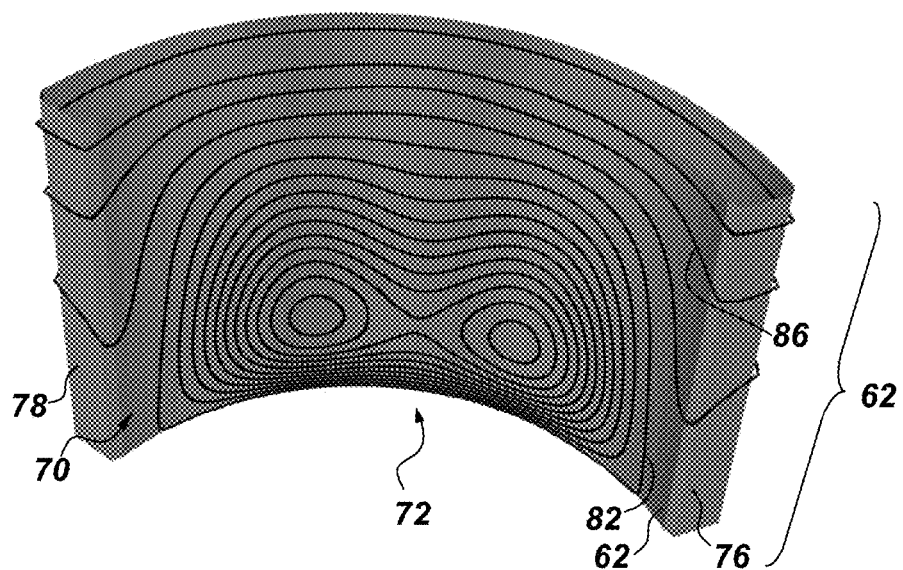
FIG. 7 is a simplified diagrammatical view of the primary coil section of FIG. 6 showing primary coil conductive paths and transverse conductive paths on a gradient substrate.
Figure 8:
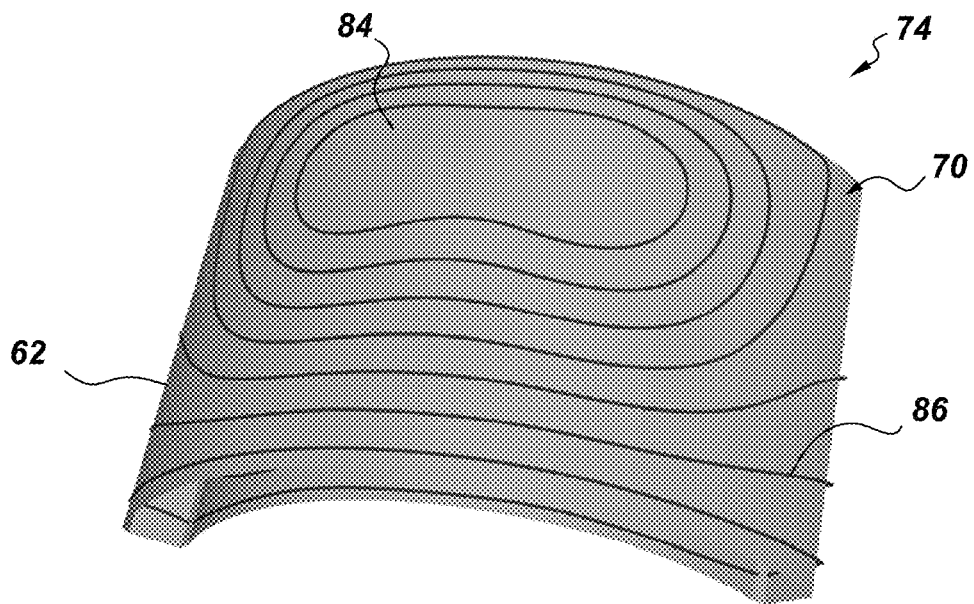
FIG. 8 is a simplified diagrammatical view of the shield coil section of FIG. 6 showing shield coil conductive paths on the gradient substrate.

As best seen in FIGS. 7 and 8, the first quadrant coil 62 portion of the first gradient coil unit 52 includes a plurality of primary coil conductive paths 82 and a plurality of shield coil conductive paths 84. The first quadrant coil 62 portion of the first gradient coil unit 52 also includes a plurality of transverse conductive paths 86 on the gradient coil substrate 70 extending across the primary coil section 72, the first return path section 76, the shield coil section 74, and the second return path section 78 as shown. The conductive paths 82, 84, and 86 may be formed as a plurality of nested closed-curve electrical traces or conductors on the gradient coil substrate 70 having the general configuration shown. It should be understood that the second quadrant coil 64 portion (not shown) of the of the first gradient coil unit 52 similarly includes the plurality of primary coil conductive paths 82, the plurality of shield coil conductive paths 84, and the plurality of transverse conductive paths 86.

The transverse conductive paths 86 crossing the primary coil section 72 and the shield coil section 74 are substantially parallel paths and substantially transverse to the gradient axis 56. In an exemplary embodiment, the transverse conductive paths 86 may include diverging and converging conductive paths when passing between the primary coil section 76 and the shield coil section 78. Specifically, the transverse conductive paths 86 diverge when passing into the first return path section 76 or into the second return path section 78, as shown. This conductive path divergence serves to insure the desired linearity and uniformity of the magnetic gradient field at the gradient axis 56. The primary coil section 72, the shield coil section 74, the first return path section 76, and the second return path section 78 may be fabricated using, for example, electrically conductive material on a flexible, insulated printed circuit board.

In the transversely-folded gradient coil configurations disclosed herein, the "turns" of the transverse conductive paths 86 run in a direction generally transverse to the gradient axis 56 (i.e., in a radial direction in the x-y plane of FIG. 4), rather than forming closed-curve electrical traces or conductors such as the primary coil conductive paths 82 and the shield coil conductive paths 84. This transverse conductive path configuration provides for an increase in gradient coil efficiency. Accordingly, the method described below may be used to calculate primary coil and shield coil electrical traces or conductors that provide for this transverse conductive path configuration, where the disclosed method also satisfies the linearity, uniformity, and leakage field requirements of the magnetic gradient. When the transversely folded gradient coil assembly 50 is powered by the gradient amplifier 46, for example, the primary coil section 72 produces the desired, primary magnetic field in the region about the gradient axis 56, and the shield coil section 74 produces an opposing magnetic field to cancel or shield that portion of the primary magnetic field that might otherwise extend outside the transversely folded gradient coil assembly 50.

Figure 9:
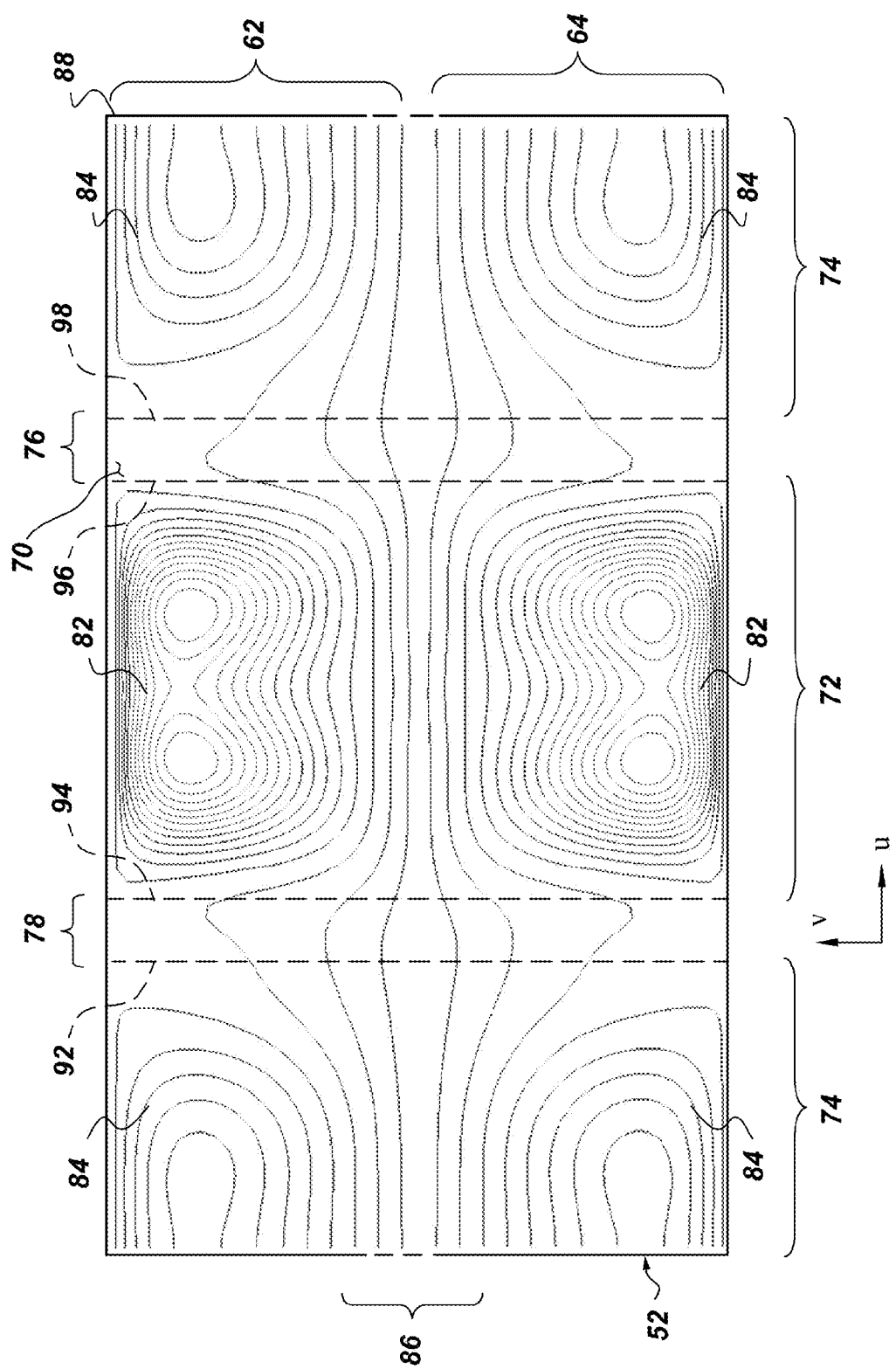
FIG. 9 is s simplified diagrammatical illustration of the upper gradient coil unit of FIG. 6 in a non-folded state showing primary coil conductive paths, shield coil conductive paths, and transverse conductive paths on the gradient coil substrate.

The transverse-folding configuration of the transversely folded gradient coil assembly 50 provides for advantageous fabrication of the first gradient coil unit 52 and the second gradient coil unit 54 from a substantially planar gradient coil substrate 70. FIG. 9 shows the first gradient coil unit 52 in a non-folded configuration, where the cylinder 80 is "opened up" at a virtual "break line" 88 so as to enable the non-folded view. The pattern of conductive electrical traces or conductors on the gradient coil substrate 70 may be derived from a solution surface defined in a u-v coordinate system oriented as shown, with the u-axis representing the transverse direction and the v-axis representing the longitudinal direction. It should be understood that the gradient coil substrate 70 comprises a surface that is continuous across the break line 88, and is here shown in planar view for clarity of illustration. The first gradient coil unit 52 includes two primary coil conductive paths 82 disposed longitudinally in the primary coil section 72, and two shield conductive paths 84 disposed longitudinally in the shield coil section 74.

The first return path section 76, defined by first and second longitudinal fold lines 92 and 94, separates the primary coil section 72 and the shield coil section 74. The second return path section 78, defined by third and fourth longitudinal fold lines 96 and 98, separates the primary coil section 72 and the shield coil section 74. The first gradient coil unit 52 also includes the plurality of transverse conductive paths 86 extending across the substrate between the primary coil conductive paths 82 and between the shield coil conductive paths 84. As can be seen, the transverse conductive paths 86 diverge and converge in the regions of the first return path section 76 and the second return path section 78.

It can be appreciated that, as the transverse direction of folding has a constant metric, the dimensions on the planar, non-folded gradient substrate 70 are substantially the same as the corresponding dimensions on the first gradient coil unit 52. The gradient substrate 70 may be folded and wrapped in a predetermined position and orientation about a supportive structure (not shown) to form the desired elliptical or cylindrical surfaces, each of which may subtend an angle of about 180 degrees, as shown in FIG. 5. In an alternative exemplary embodiment (not shown), the gradient coil units may be configured to subtend an angle of less than 180 degrees, to as small as forty five degrees, such that the transversely folded gradient coil assembly may comprise three or more gradient coil units.

Figure 10:
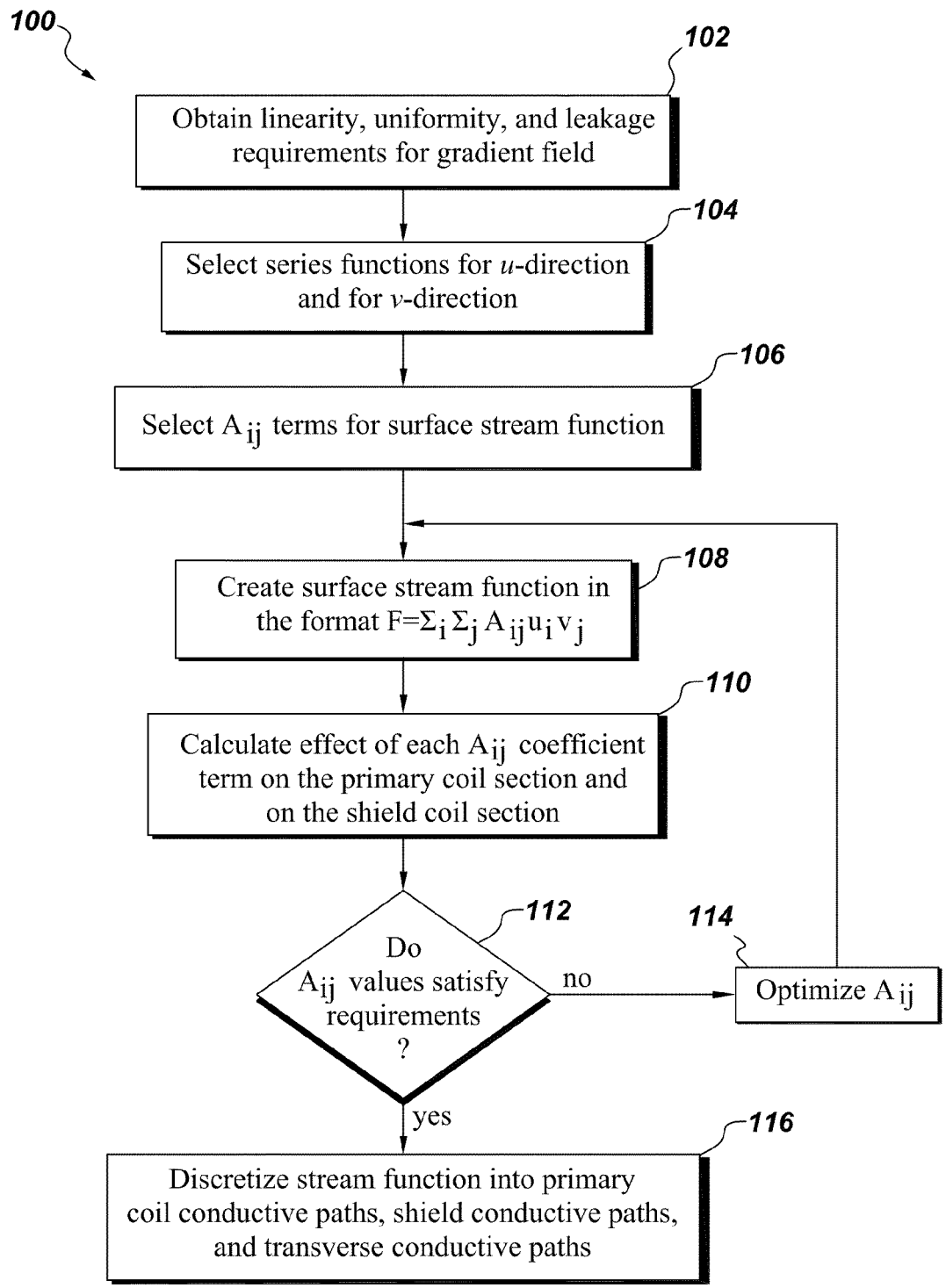
FIG. 10 is a flow chart illustrating a method of deriving the primary coil conductive paths, the shield coil conductive paths, and the transverse conductive paths of FIG. 9 for a transversely folded gradient coil, in accordance with an aspect of the present invention.

The flow chart 100 of FIG. 10 illustrates an exemplary method of determining a pattern of electrical traces or conductors for the gradient circuit substrate 70. Pre-established linearity, uniformity, and leakage field requirements for the current paths in the gradient coil unit 52 are obtained, in step 102. Further constraints may be added to ensure that current remains inside the surface boundaries of the corresponding coil sections. At step 104, a two-dimensional stream function (F) may be used for determining current density, where the stream function (F) utilizes the outer product of a series expansion in the current loop u-direction and the axial v-direction of the gradient coil unit 52.

The mapping of the local u-axis and v-axis into real space is such that u maps into the path around the unfolding direction (traversing r and $\phi$) and v maps into the z-direction. Appropriate one-dimensional series functions are selected in both the u- and v-directions. In an exemplary example, a Fourier series may be selected in the u-direction and a polynomial series may be selected in the v-direction. The two-dimensional stream function for the surface is then calculated, at step 106, as $F=\Sigma_i\Sigma_j A_{ij} u_i v_j$ where $A_{ij}$ is the stream function coefficient for the ij term, $u_i$ is the $i^{th}$ term in the Fourier series, and $v_j$ is the $j^{th}$ term of the polynomial series. The stream function coefficients $A_{ij}$ may be calculated using linear or quadratic programming methods.

At step 108, the flux density (linearity and leakage) and flux density gradient (uniformity) of each $A_{ij}$ coefficient is calculated on a target set of field points on the imaging volume and any surface where the leakage field should be limited or minimized. If the requirements of desired linearity, uniformity, and leakage values are not satisfied, at decision block 112, the stream function coefficients $A_{ij}$ may be optimized by a linear, quadratic, or other optimization scheme, at step 114, so as to satisfy the desired linearity, uniformity, and leakage values, and the process returns to step 108 for calculation of a new stream function $F'=\Sigma_i\Sigma_j A_{ij} u_i v_j$. Further, one skilled in the art could add other quantities such as inductance, power, force, or torque to the optimization. It may also be necessary to add constraints to edges of the mapping surface in the v-direction to ensure that no current exits the substrate sheet. In the u-direction, the current path is self closing.

If the requirements of desired linearity, uniformity, and leakage values are satisfied, at decision block 112, the stream function (F) may be discretized into the primary coil conductive paths 82, the shield coil conductive paths 84, and the transverse conductive paths 86, at step 116. The method shown may also be applied to the fabrication of the second gradient coil unit 54 or to similar gradient coil units for use in the magnetic resonance unit 30.

While the present invention is described with reference to various exemplary embodiments, it will be understood by those skilled in the art that various changes may be made and equivalence may be substituted for elements thereof without departing from the scope of the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. In particular, certain modifications may be made to the teachings of the invention to adapt to a particular situation without departing from the scope thereof. Therefore, it is intended that the invention not be limited to the embodiments disclosed above for carrying out this invention, but that the invention include all embodiments falling with the scope of the intended claims.

What is claimed is:

1. A gradient coil comprising:
    a first gradient coil unit and a second gradient coil unit disposed so as to enclose a gradient axis therebetween, each said gradient coil unit including:
        a gradient coil substrate with a primary coil section, a shield coil section, a first return path section, and a second return path section, said primary coil section disposed between said gradient axis and said shield coil section, said primary coil section configured to produce a magnetic gradient field at said gradient axis when conducting an electrical current;
        said first return path section foldably connected between said primary coil section and said shield coil section with said second return path section foldably connected between said shield coil section and said primary coil section such that said gradient coil substrate forms a cylindrical surface having a longitudinal axis substantially aligned with said gradient axis; and
        a plurality of substantially parallel transverse conductive paths disposed across said cylindrical surface in a direction transverse to said gradient axis.

2. The gradient coil system of claim 1 wherein said primary coil section comprises first and second primary coil conductive paths, each said primary coil conductive path including a plurality of nested, substantially closed curve conductive traces.

3. The gradient coil system of claim 2 wherein said plurality of substantially parallel transverse conductive paths is disposed between said first primary conductive path and said second primary conductive path.

4. The gradient coil system of claim 1 wherein said shield coil section comprises first and second shield coil conductive paths, each said shield coil conductive path including a plurality of nested, substantially closed curve conductive traces.

5. The gradient coil system of claim 1 wherein said plurality of substantially parallel transverse conductive paths comprises diverging conductive paths when passing into said first return path section.

6. The gradient coil system of claim 1 wherein said shield coil section is configured to shield said magnetic gradient field produced by said primary coil section.

7. The gradient coil system of claim 6 wherein said shield coil section is configured to shield that portion of said magnetic gradient field that might otherwise extend radially beyond said first gradient coil unit.

8. The gradient coil system of claim 1 wherein said first gradient coil unit subtends an angle of about forty five degrees to about 180 degrees.

9. The gradient coil system of claim 1 wherein said primary coil section comprises an electrically conductive material disposed on a flexible insulated printed circuit board.

10. A magnetic resonance imaging system comprising:
    a main magnet enclosing an imaging volume;
    an RF coil disposed within said main magnet; and
    a gradient coil assembly disposed within said RF coil, said gradient coil assembly having a pair of gradient coil substrates, each said gradient coil substrate including:
        a primary coil section configured to produce a magnetic gradient field at a longitudinal gradient axis;
        a shield coil section foldably connected with said primary coil section, said shield coil section further disposed between said primary coil section and said main magnet; and
        a plurality of substantially parallel transverse conductive paths disposed across said gradient coil substrate in a direction transverse to said gradient axis; and
    a gradient amplifier for powering said gradient coil assembly.

11. The magnetic resonance imaging system of claim 10 wherein said plurality of transverse conductive paths are disposed between a pair of primary coil conductive paths in said primary coil conductive section.

12. The magnetic resonance imaging system of claim 10 wherein said gradient coil substrate is folded at a first fold line between said shield coil section and a return path section, and folded at a second fold line between said return path section and said primary coil section.

13. The magnetic resonance imaging system of claim 10 wherein said shield coil section comprises a pair of shield coil conductive paths spaced apart in the longitudinal direction.

14. The magnetic resonance imaging system of claim 13 wherein said shield coil conductive paths are disposed proximate said primary coil so as to shield said magnetic gradient field.

15. A method for fabricating a gradient coil for producing a magnetic gradient field, said method comprising the steps of:
- obtaining at least one of linearity, uniformity, and leakage requirements for the magnetic gradient field;
- selecting two-dimensional series functions for determining current patterns to be implemented on a gradient coil substrate having a primary coil section and a shield coil section;
- selecting surface stream function coefficients $A_{ij}$;
- creating a surface stream function having the format $F=\Sigma_i\Sigma_j A_{ij} u_i v_j$;
- calculating the effect of each said stream function coefficient $A_{ij}$ on said primary coil section and said shield coil section;
- verifying that each said stream function coefficient $A_{ij}$ satisfies said at least one linearity, uniformity, and leakage requirement;
- discretizing said stream function into a primary conductive path pattern and a shield conductive path pattern; and
- forming primary conductive paths and shield conductive paths on said gradient coil substrate in accordance with said primary conductive path pattern and a shield conductive path pattern.

16. The method of claim 15 further comprising the step of repeating said steps of selecting surface stream function coefficients $A_{ij}$, creating a surface stream function having the format $F=\Sigma_i\Sigma_j A_{ij} u_i v_j$, and calculating the effect of each said stream function coefficient $A_{ij}$ on said primary coil section and said shield coil section if said step of verify indicates that said stream function coefficients $A_{ij}$ do not satisfy at lease one of said at least one linearity, uniformity, and leakage requirement.

17. The method of claim 16 wherein said surface stream function comprises at least one of a Fourier series and a polynomial series.

18. The method of claim 15 wherein said step of selecting surface stream function coefficients $A_{ij}$ comprises one of a linear programming method and a quadratic programming method.

19. The method of claim 15 further comprising the step of discretizing said stream function into a transverse conductive path pattern.

20. The method of 19 wherein said step of forming further comprises the step of forming a transverse conductive path on said gradient coil substrate in accordance with said transverse conductive path pattern.

* * * * *

UNITED STATES PATENT AND TRADEMARK OFFICE
CERTIFICATE OF CORRECTION

PATENT NO. : 7,932,722 B2  
APPLICATION NO. : 12/430874  
DATED : April 26, 2011  
INVENTOR(S) : Amm et al.

Page 1 of 1

It is certified that error appears in the above-identified patent and that said Letters Patent is hereby corrected as shown below:

In Column 10, Line 26, in Claim 20, delete "of 19" and insert -- of claim 19 --, therefor.

Signed and Sealed this
Sixteenth Day of August, 2011

David J. Kappos
*Director of the United States Patent and Trademark Office*